United States Patent
Liang

(10) Patent No.: US 7,499,289 B2
(45) Date of Patent: Mar. 3, 2009

(54) SERVER WHEREIN AN INTERIOR OF WHICH IS CONNECTED WITH FIVE EXPANSION BOARDS

(75) Inventor: Chien-Fa Liang, Chung-Ho (TW)

(73) Assignee: Super Micro Computer, Inc., San Jose, CA (US)

( * ) Notice: Subject to any disclaimer, the term of this patent is extended or adjusted under 35 U.S.C. 154(b) by 168 days.

(21) Appl. No.: 11/594,223

(22) Filed: Nov. 8, 2006

(65) Prior Publication Data

US 2008/0106862 A1    May 8, 2008

(51) Int. Cl.
  *H05K 7/14* (2006.01)
  *H05K 7/18* (2006.01)
(52) U.S. Cl. .................. 361/796; 361/752; 361/730; 361/728; 361/683; 710/301; 174/50; 174/520
(58) Field of Classification Search ......... 361/728–730, 361/752, 796, 797, 679, 683, 686; 174/50, 174/520; 710/301
  See application file for complete search history.

(56) References Cited

U.S. PATENT DOCUMENTS

| | | | | |
|---|---|---|---|---|
| 5,440,755 A | * | 8/1995 | Harwer et al. ............. 710/315 |
| 5,963,431 A | * | 10/1999 | Stancil ........................ 361/803 |
| 6,067,226 A | * | 5/2000 | Barker et al. ................ 361/686 |
| 6,273,730 B1 | * | 8/2001 | Chang ......................... 439/61 |
| 6,504,725 B1 | * | 1/2003 | Lam ............................ 361/785 |
| 6,533,587 B1 | * | 3/2003 | Potter et al. ................... 439/65 |
| 6,644,979 B2 | * | 11/2003 | Huang ......................... 439/65 |
| 6,728,108 B2 | * | 4/2004 | Chen .......................... 361/736 |
| 6,805,560 B1 | * | 10/2004 | Budny et al. ................. 439/65 |
| 2004/0240173 A1 | * | 12/2004 | Yi et al. ...................... 361/686 |

* cited by examiner

*Primary Examiner*—Dameon E Levi
(74) *Attorney, Agent, or Firm*—Troxell Law Office PLLC

(57) ABSTRACT

A server wherein an interior of which is connected with five expansion boards is composed of a server at a height of 1U, an interior of which is fixed with a circuit motherboard on which is welded with expansion slots; a first riser card which is inserted into the first expansion slot; a first expansion board which is inserted into a transversal slot of the first riser card; a second riser card which is inserted into the second expansion slot; a second expansion board which is inserted into a transversal slot of the second riser card; a third riser card which is inserted into the third expansion slot; a third expansion board which is inserted into a transversal slot of the third riser card; a fourth riser card which is inserted into the fourth expansion slot; a fourth expansion board which is inserted into a lower slot; and a fifth expansion board which is inserted into an upper slot; such that the circuit motherboard, and five expansion boards are installed in the server.

5 Claims, 6 Drawing Sheets

SERVER WHEREIN AN INTERIOR OF WHICH IS CONNECTED WITH FIVE EXPANSION BOARDS

BACKGROUND OF THE INVENTION a) Field of the Invention

The present invention relates to a server wherein an interior of which is connected with five expansion boards, and more particularly to a server, a casing of which is at a height of 1 U, and an interior of which is connected with five expansion boards.

b) Description of the Prior Art

It is known that more and more functions of an industrial computer server are required, such as that a computer host should control a plurality of machine tools, and should transmit and process a lot of data signals. However, under a restriction of a height of 1 U (1.75 in.) to a server casing, interiors of the industrial computer servers sold on the market can be at most connected with three expansion boards on circuit motherboards, thereby being unable to meet the market needs.

Accordingly, how to develop a technique to connect five expansion boards in the server at 1 U height is an issue to be solved by the present inventor.

SUMMARY OF THE INVENTION

The primary object of present invention is to provide a server wherein an interior of which is connected with five expansion boards, more particularly, in the interior of a server casing at a height of 1 U, a motherboard can be connected with five expansion boards, to enable the server to process and transmit more signal data.

To enable a further understanding of the said objectives and the technological methods of the invention herein, the brief description of the drawings below is followed by the detailed description of the preferred embodiments.

DETAILED DESCRIPTION OF THE PREFERRED EMBODIMENTS

Figure 1:
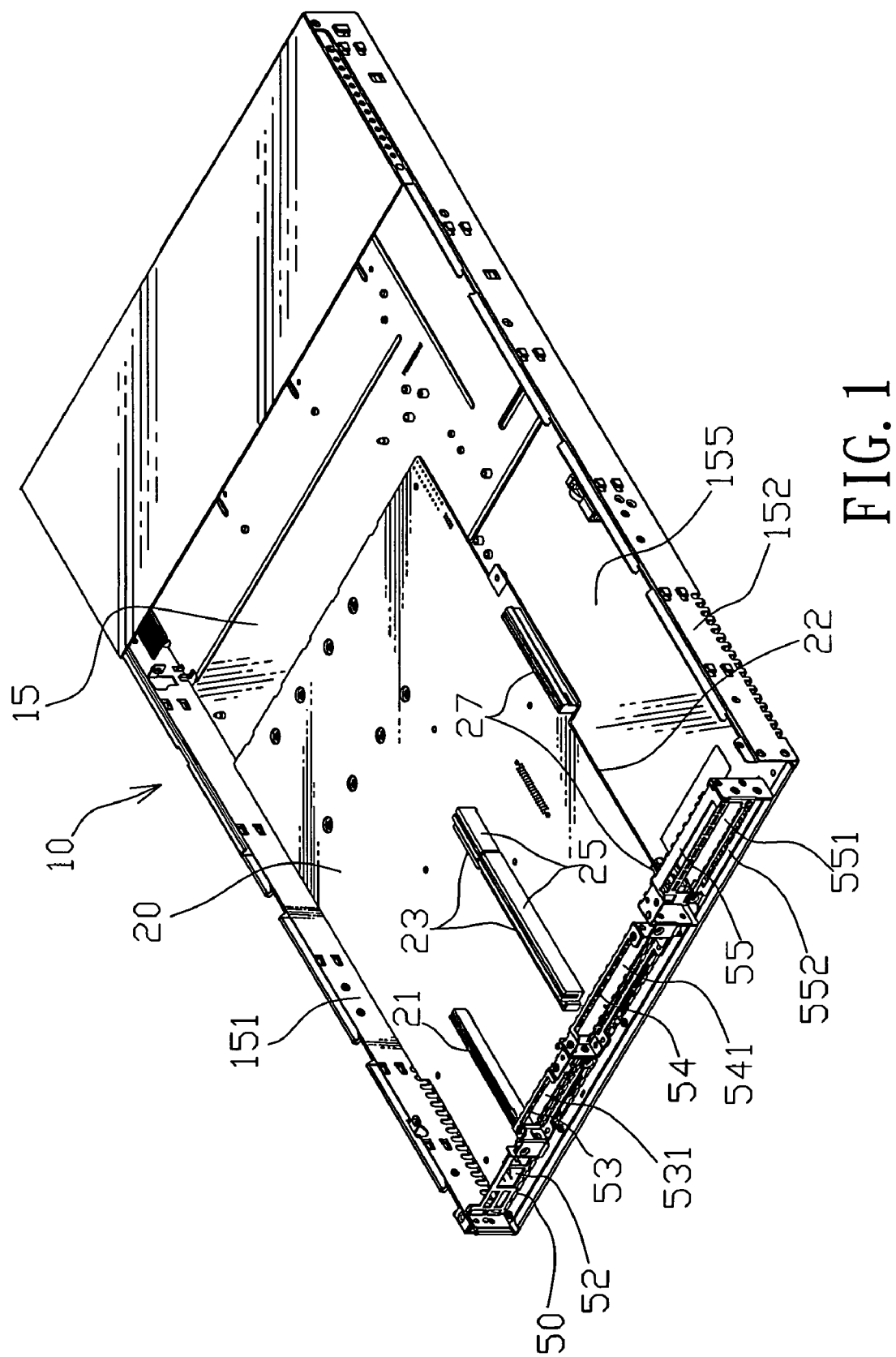
FIG. 1 shows a perspective view of a server of the present invention, wherein a bottom casing is installed with a circuit motherboard.

Referring to FIG. 1, the present invention includes a server 10 at a height of 1 U, a bottom casing 15 of which is fixed with a circuit motherboard 20. A surface of the circuit motherboard 20 is welded with a first expansion slot 21, a second expansion slot 23, a third expansion slot 25, and a fourth expansion slot 27.

Figure 2:
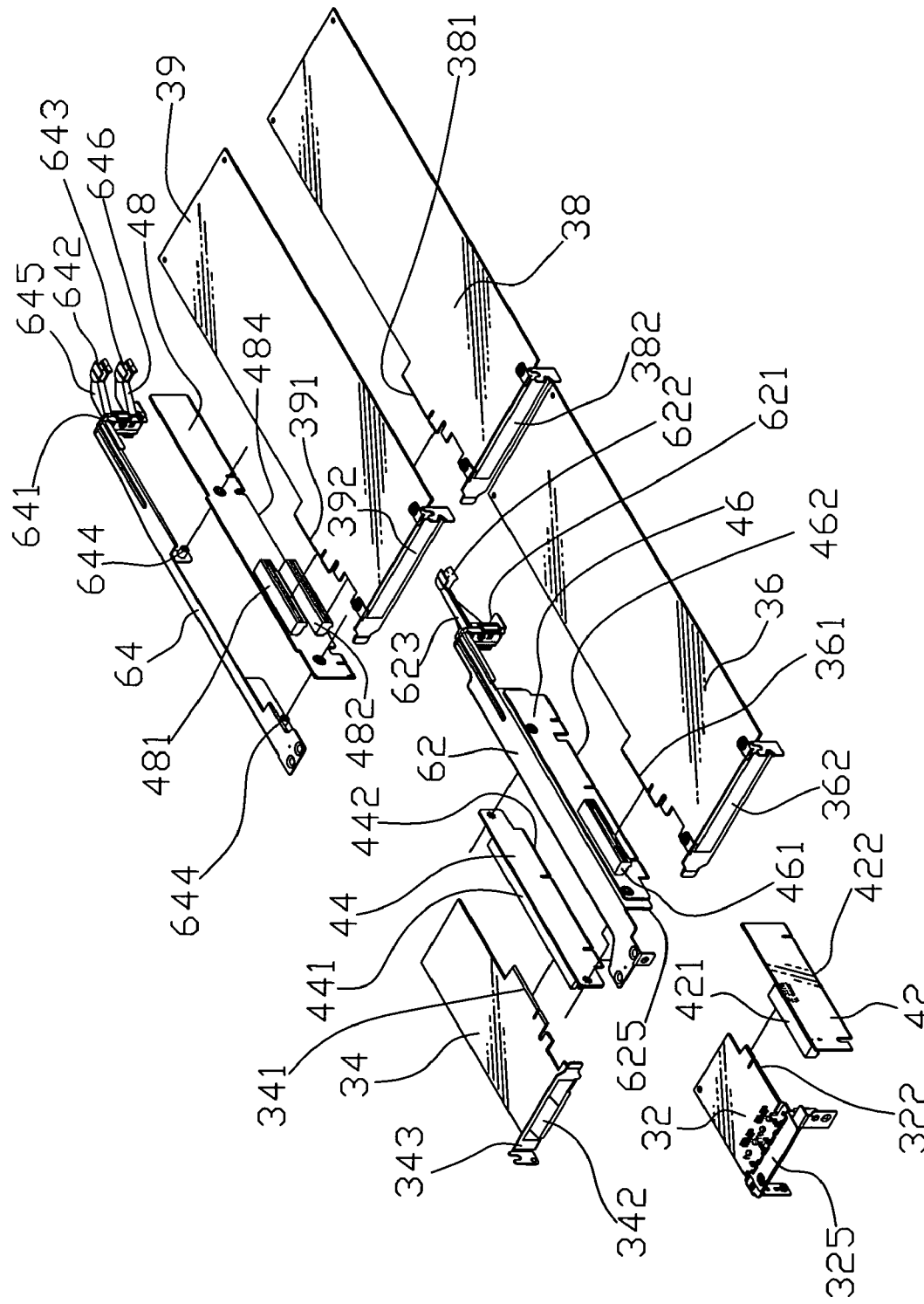
FIG. 2 shows an exploded view of five expansion boards of the present invention, which are connected to riser cards and a first and second arms.
Figure 3:
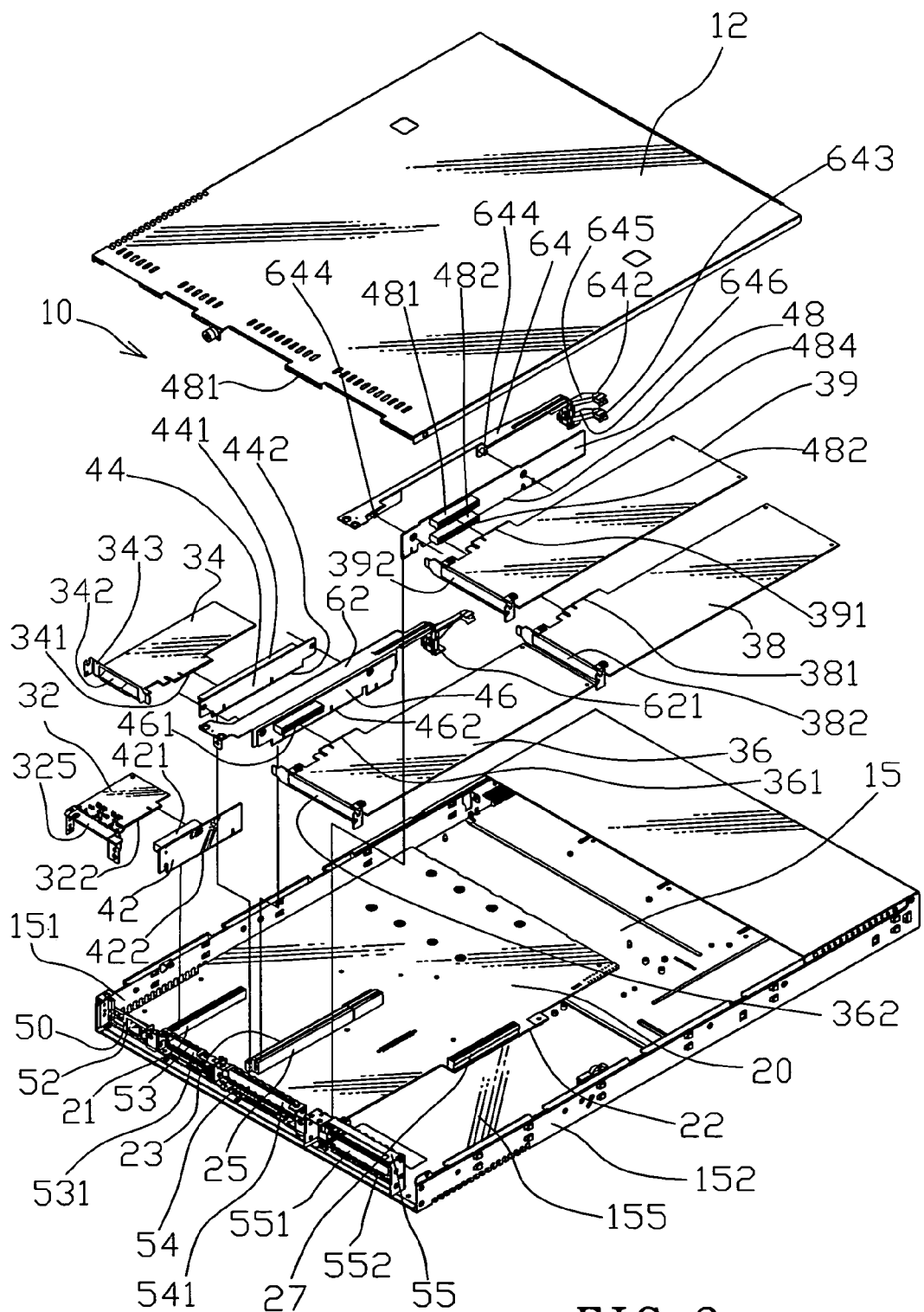
FIG. 3 shows an exploded view of components of a server of the present invention.

Referring to FIG. 2 and FIG. 3, it shows a first riser card 42, a surface of which is welded with a transversal slot 421, and a signal transmission end 422 of which is inserted into the first expansion slot 21; a first expansion board 32, a signal transmission end 322 of which is inserted into the slot 421 of first riser card 42; a second riser card 44, a surface of which is welded with a transversal slot 441, and a signal transmission end 442 of which is inserted into the second expansion slot 23; a second expansion board 34, a signal transmission end 341 of which is inserted into the transversal slot 441 of second riser card 44; a third riser card 46, a surface of which is welded with a transversal slot 461, and a signal transmission end 462 of which is inserted into the third expansion slot 25; a third expansion board 36, a signal transmission end 361 of which is inserted into the transversal slot 461 of third riser card 46; a fourth riser card 48, a surface of a same side of which is provided with an upper slot 481 and a lower slot 482, and a signal transmission end 484 of which is inserted into the fourth expansion slot 27; a fourth expansion board 38, a signal transmission end 381 of which is inserted into the lower slot 482 of fourth riser card 48; and a fifth expansion board 39, a signal transmission end 391 of which is inserted into the upper slot 481 of fourth riser card 48. Accordingly, the circuit motherboard 20, and the first, second, third, fourth, and fifth expansion boards 32, 34, 36, 38, 39 are constituted in the interior of server 10.

Referring to FIG. 1, the first expansion slot 21 is welded on a surface of the circuit motherboard 20, at a location close to a left wall 151 of the bottom casing 15. A side of the first expansion slot 21 is installed respectively with the second expansion slot 23 and the third expansion slot 25 at locations a little closer to a center of the circuit board 20. The second expansion slot 23 and third expansion slot 25 are constituted by two sockets which are aligned linearly, and the second expansion slot 23 and third expansion slot 25 are next to each other. The fourth expansion slot 27 is constituted by two sockets which are spaced linearly and are installed at an edge of the circuit motherboard 20, respectively.

Referring to FIG. 1, between a right edge 22 of the circuit motherboard 20 and a right wall 152 of the bottom casing 15 is provided with a holding space 155.

Figure 4:
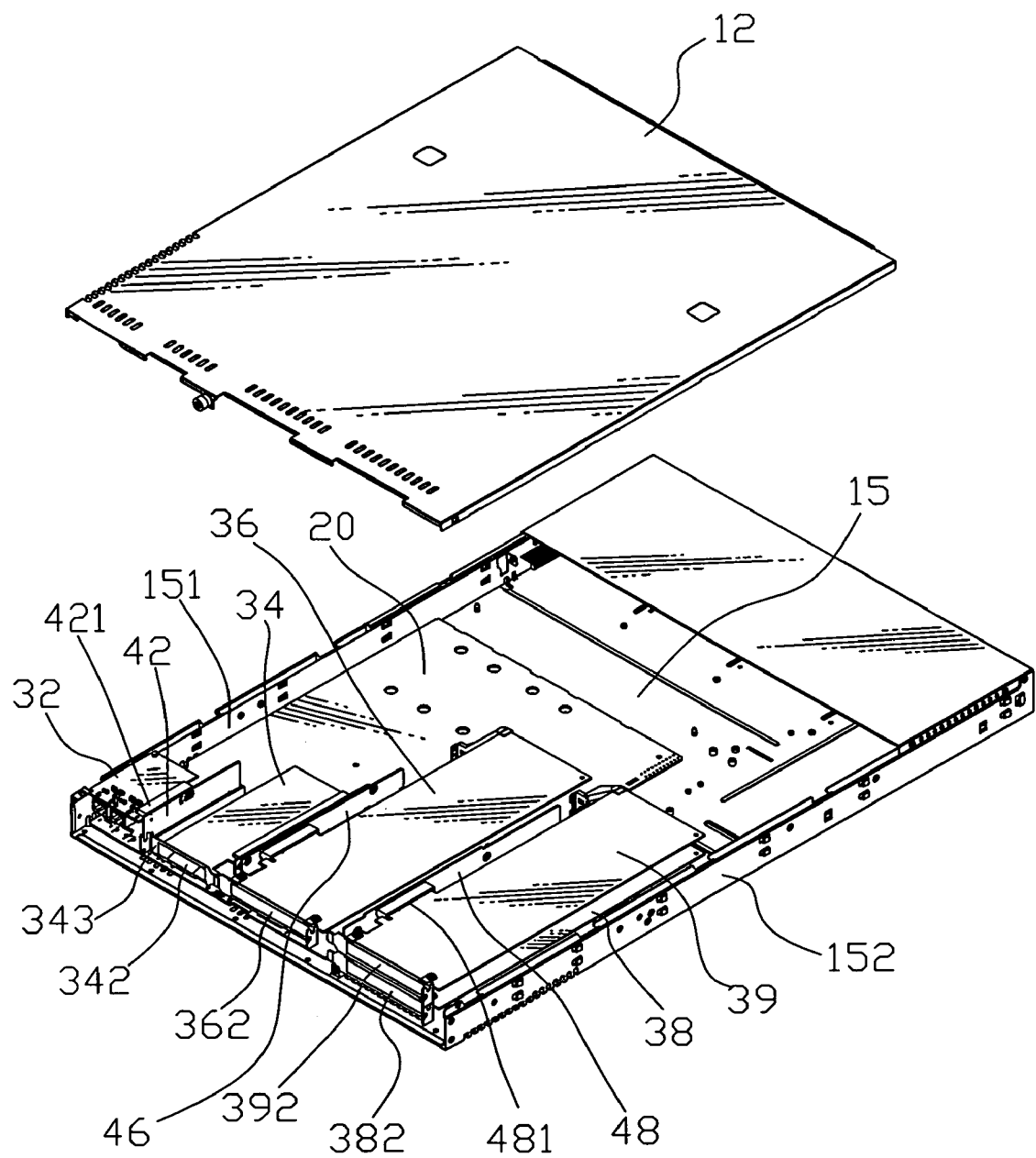
FIG. 4 shows a perspective view of a circuit motherboard and five expansion boards in a server casing of the present invention.

Referring to FIG. 4, the fourth and fifth expansion boards 38, 39 are overlapped on each other and are installed in the holding space 155, with a total height of overlapping lower than that of the right wall 152.

Referring to FIG. 1 and FIG. 3, a vertical first bracket 50 is located at a front exit of the bottom casing 15 and close to the left wall 151. The first bracket 50 is provided with at least more than one through-hole 52. A front end of the first expansion board 32 is fixed with a U-shape frame 325 which is fixed on the first bracket 50, and a second bracket 53 is vertically installed on a connection edge at a side of the first bracket 50 and is provided with a long through-hole 531. A front end of the second expansion board 34 is connected with a fixing piece 343 which is provided with a long through-hole 342. The fixing piece 343 is fixed on the second bracket 53, and the long through-hole 342 is connected to the long through-hole 531 of the second bracket 53.

Referring to FIG. 1, a third bracket 54 is vertically installed on a connection edge at a side of the second bracket 53, and is provided with a long through-hole 541.

Referring to FIG. 3, a front end of the third expansion board 36 is connected with a covering board 362 which is fixed on the third bracket 54 to close the long through-hole 541.

Referring to FIG. 1, a fourth bracket 55 is vertically installed on a connection edge at a side of the third bracket 54, and is provided with an upper through-hole 551 and a lower through-hole 552 which are parallel to each other.

Referring to FIG. 3, front ends of the fourth and fifth expansion boards 38, 39 are connected with covering boards 382, 392 respectively. These two covering boards 382, 392 are fixed on the fourth bracket 55 to close the upper and lower through-holes 551, 552.

Referring to FIG. 3, a top of the bottom casing 15 is covered with an upper lid 12.

Figure 5:
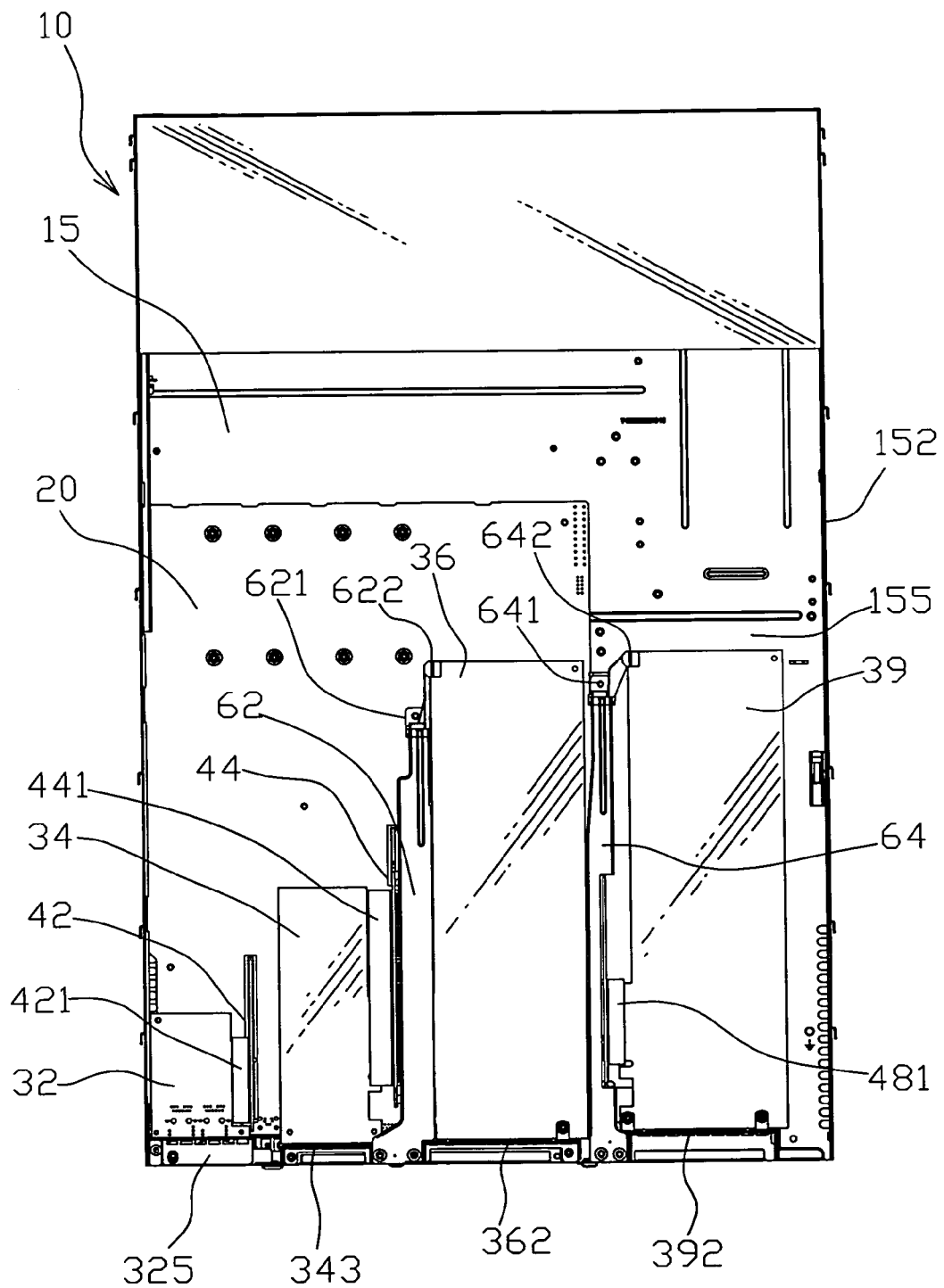
FIG. 5 shows a top view of a circuit motherboard and five expansion boards in a server casing of the present invention.
Figure 6:
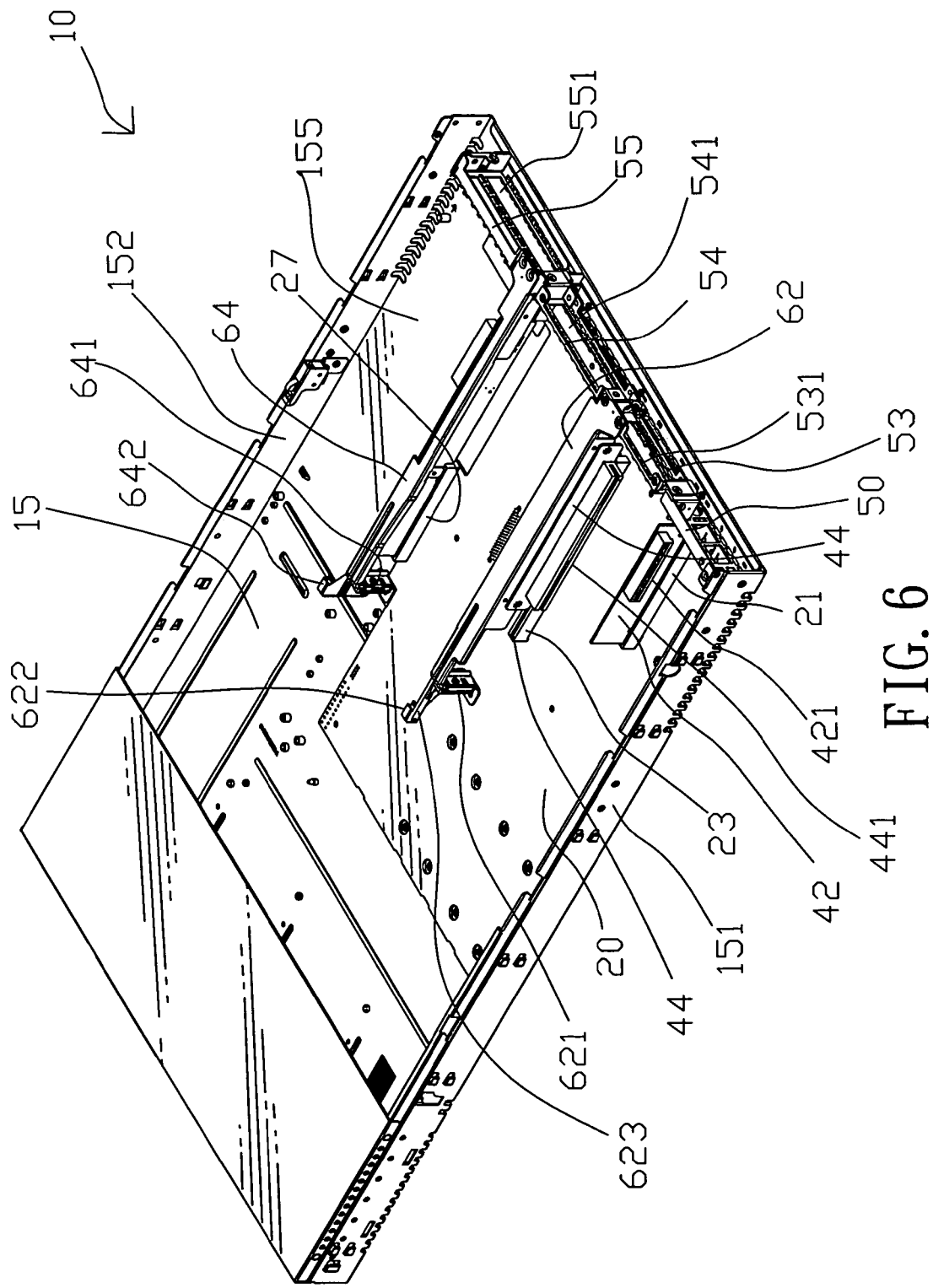
FIG. 6 shows a perspective view of a circuit motherboard in a server casing of the present invention, which are connected to a first and second arms.

Referring to FIGS. 2, 5, 6, in the server 10 wherein an interior of which is connected with five expansion boards, a connection surface between the second bracket 53 and the third bracket 54 is fixed with a horizontal first long arm 62, and a connector 621 is installed on the circuit motherboard 20. An upper end of the connector 621 is connected to an end part of the first long arm 62, and an exterior end of the connector 621 is connected to an extended bracket 623. The extended bracket 623 is horizontally installed, and a side of an end part of which is provided with an elastic groove 622. A connection surface between the third bracket 54 and the fourth bracket 55 is fixed with a horizontal second long arm 64, a connector 641 is installed on a surface of the bottom casing 15, and an upper end of the connector 641 is connected to an end part of the second long arm 64. As shown in FIG. 2, an exterior end of the connector 641 is connected with two extended brackets 645, 646 which are parallel to each other. Exterior ends of the extended brackets 645, 646 are provided with elastic grooves 642, 643 respectively, wherein the upper elastic groove 642 is used to clip a rear board edge of the fifth expansion board 39, and the lower elastic groove 643 is used to clip a rear board edge of the fourth expansion board 38.

Referring to FIG. 2, the second riser card 44 and the third riser card 46 are screwed to a lower board surface 625 of the first long arm 62, and the fourth riser card 48 is screwed to a lower screw-hole 644 of the second long arm 64.

Referring to FIG. 1, a bottom casing 15 of a server 10 of the present invention is screwed with a circuit motherboard 20. Referring to FIG. 3, it shows an exploded view of the circuit motherboard 20, a first expansion board 32, a second expansion board 34, a third expansion board 36, a fourth expansion board 38, and a fifth expansion board 39. The bottom casing 15 is provided with a left wall 151 and a right wall 152, a left board surface of the circuit motherboard 20 is abutted on an inner wall of the left wall 151 of bottom casing 15, a front end of the circuit motherboard 20 is close to a front exit of the bottom casing 15, and the circuit motherboard 20 is screwed on the bottom casing 15. A height of the left, right walls 151, 152 is about 1 U, and the circuit motherboard 20 is as close as possible to a bottom surface of the bottom casing 15. However, there is still a gap between the circuit motherboard 20 and the bottom casing 15, and a holding space 155 is located between a right edge 22 of the circuit motherboard 20 and the right wall 152. At proper positions on a surface of the circuit motherboard 20 are provided with a first expansion slot 21, a second expansion slot 23, a third expansion slot 25, and a fourth expansion slot 27, respectively.

Referring to FIG. 2, a surface of a first riser card 42 is welded with a transversal slot 421 which provides for an insertion of the first expansion board 32. A signal transmission end 422 of the first riser card 42 is again inserted into the first expansion slot 21 (as shown in FIG. 3), such that the first riser card 42 can be horizontally positioned on a top of the circuit motherboard 20, without exceeding a height of 1 U (as shown in FIG. 4).

Referring to FIG. 2, a surface of a second riser card 44 is welded with a transversal slot 441 which provides for an insertion of the second expansion board 34. A signal transmission end 442 of the second riser card 44 is inserted into the second expansion slot 23 (as shown in FIG. 3), such that the second expansion board 34 can be horizontally positioned on a top of the circuit motherboard 20, without exceeding a height of 1 U (as shown in FIG. 4).

Referring to FIG. 3, a surface of a third riser card 46 is welded with a transversal slot 461 which provides for an insertion of the third expansion board 36. A signal transmission end 462 of the third riser card 46 is inserted into the third expansion slot 25, such that the third expansion board 36 can be horizontally positioned on a top of the circuit motherboard 20, without exceeding a height of 1 U (as shown in FIG. 4).

Referring to FIG. 2, a same side surface of a fourth riser card 48 is welded with an upper slot 481 and a lower slot 482 which are parallel to each other. A signal transmission end 484 of the fourth riser card 48 is inserted into the fourth expansion slot 27 having two sockets that are separated with each other (as shown in FIG. 3), a signal transmission end 381 of the fourth expansion board 38 is inserted into the lower slot 482, and a signal transmission end 391 of the fifth expansion board 39 is inserted into the upper slot 481. The fourth and fifth expansion boards 38, 39 are overlapped with each other into two layers to be parallel to each other, and are positioned on a top of the circuit motherboard 20. A height of the fourth expansion board 38 does not exceed a limit of 1 U (as shown in FIG. 4).

Referring to FIGS. 1 to 3, a front end of the first expansion board 32 is fixed with a U-shape frame 325, a first bracket 50 which is provided with a plurality of through-holes 52 is fixed at a corner position in a front of the bottom casing 15 and the left wall 151, and the U-shape frame 325 is fixed at a rear side of the first bracket 50. A fixing piece 343, a center of which is provided with a long through-hole 342, is fixed at a front end of the second expansion board 34, and a second bracket 531, a center of which is provided with a long through-hole 531, is fixed at a side of the first bracket 50. As shown in FIG. 3, the fixing piece 343 is fixed on the second bracket 53, and the long through-hole 531 is connected with the other long through-hole 342. A covering board 362 is connected to a front end of a third bracket 54 which is provided with a long through-hole 541, and is fixed on the third bracket 54 to cover the long through-hole 541. As shown in FIG. 1, a fourth bracket 55, a center of which is provided with an upper through-hole 551 and a lower through-hole 552, is installed at a side of the third bracket 54. As shown in FIG. 2, the covering board 362 is connected at a front end of the fifth expansion board 39, and is fixed on the fourth bracket 55 (as shown in FIG. 3), to close the upper through-hole 551. Another covering board 382 is connected at a front end of the fourth expansion board 38, and is fixed on the fourth bracket 55 to close the lower through-hole 552 (as shown in FIG. 3). As shown in FIG. 4, the positioning locations of the fixing piece 343, and the covering boards 362, 392, 382 can be clearly seen by eliminating the first bracket 50, the second bracket 53, the third bracket 54, and the fourth bracket 55.

Referring to FIGS. 2, 3, 5, 6, a first long arm 62 is fixed on a connection surface between the second bracket 53 and the third bracket 54. An end part of the first long arm 62 is then installed on a top of the circuit motherboard 20 through a connector 621, and is provided with an elastic groove 622 to clip and position the third expansion board 36.

A connection end of a second long arm 64 is fixed on a connection surface between the third bracket 54 and the fourth bracket 55, whereas the other end is installed on the bottom casing 15 through a connector 641, wherein the upper groove 642 is used to clip the fifth expansion board 39, and a lower groove 643 is used to clip the fourth expansion board 38, so as to further rigidly position the third, fourth, and fifth expansion boards 36, 38, 39 in the bottom casing 15.

Referring to FIG. 3, an outer lid 12 is covered on the bottom casing 15.

Accordingly, the interior of server of present invention can be installed with five expansion boards, such that more data can be processed and transmitted to meet the market needs.

It is of course to be understood that the embodiments described herein is merely illustrative of the principles of the invention and that a wide variety of modifications thereto may be effected by persons skilled in the art without departing from the spirit and scope of the invention as set forth in the following claims.

What is claimed is:

1. A server wherein an interior of which is connected with five expansion boards, comprising: a server at a height of 1 U, a bottom casing of which is fixed with a circuit motherboard on which is welded with a first expansion slot, a second expansion slot, a third expansion slot, and a fourth expansion slot; a first riser card, a surface of which is welded with a transversal slot, and a signal transmission end of which is inserted into the first expansion slot; a first expansion board, a signal transmission end of which is inserted into the slot of first riser card; a second riser card, a surface of which is welded with a transversal slot, and a signal transmission end of which is inserted into the second expansion slot; a second expansion board, a signal transmission end of which is inserted into the transversal slot of second riser card; a third riser card, a surface of which is welded with a transversal slot, and a signal transmission end of which is inserted into the third expansion slot; a third expansion board, a signal transmission end of which is inserted into the transversal slot of third riser card; a fourth riser card, a surface of a same side of which is provided with an upper slot and a lower slot, and a signal transmission end of which is inserted into the fourth expansion slot; a fourth expansion board, a signal transmission end of which is inserted into the lower slot of fourth riser card; and a fifth expansion board, a signal transmission end of which is inserted into the upper slot of fourth riser card; such that the circuit motherboard, and the first, second, third, fourth, fifth expansion boards are installed in the interior of server, wherein a vertical first bracket is located at a front exit of the bottom casing, and close to the left wall, having at least more than one through-hole; a front end of the first expansion board is fixed with a U-shape frame which is fixed on the first bracket; a second bracket is vertically installed on a connection edge at a side of the first bracket and is provided with a long through-hole; a front end of the second expansion board is connected with a fixing piece which is provided with a long through-hole and is fixed on the second bracket, with the long through-hole being connected with the long through-hole of second bracket; a third bracket is vertically installed on a connection edge at a side of the second bracket, and is provided with a long through-hole; a front end of the third expansion board is connected with a covering board which is fixed on the third bracket to close the long through-hole; a fourth bracket is vertically installed on a connection edge at a side of the third bracket, and is provided with an upper through-hole and a lower through-hole which are parallel to each other; and front ends of the fourth, fifth expansion boards are respectively connected with two covering boards which are fixed on the fourth bracket to close the upper and lower through-holes.

2. The server wherein an interior of which is connected with five expansion boards, according to claim 1, wherein the first expansion slot is welded on a surface of the circuit motherboard, at a location close to a left wall of the bottom casing; the second and third expansion slots are respectively installed at a side of the first expansion slot, at locations a little closer to a center of the circuit motherboard, are constituted by two sockets aligned linearly, and are next to each other; and the fourth expansion slot is constituted by two sockets which are separated with each other in a straight line and are installed at an edge of the circuit motherboard, respectively.

3. The server wherein an interior of which is connected with five expansion boards, according to claim 1, wherein a holding space is located between a right edge of the circuit motherboard and a right wall of the bottom casing; and the fourth and fifth expansion boards are overlapped with each other and installed in the holding space, with a total height of overlapping being lower than that of the right wall.

4. The server wherein an interior of which is connected with five expansion boards, according to claim 1, wherein a top of the bottom casing is covered with an upper lid.

5. The server wherein an interior of which is connected with five expansion boards, according to claim 1, wherein a connection surface between the second bracket and the third bracket is fixed with a horizontal first long arm, and a connector is installed on the circuit motherboard, with an upper end of the connector being connected to an end part of the first long arm, and an exterior end of the connector being connected with an extended bracket which is installed horizontally, with an elastic groove being located at a side of the end part; a connection surface between the third bracket and the fourth bracket is fixed with a horizontal second long arm, and a connector is installed on a surface of the bottom casing, with an upper end of the connector being connected to an end part of the second long arm, and an exterior end of the connector being connected with two extended brackets, which are parallel to each other, and exterior ends of which are provided with elastic grooves respectively; the upper elastic groove being used to clip a board edge at a rear side of the fifth expansion board, and the lower elastic groove being used to clip a board edge at a rear side of the fourth expansion board; the second riser card and the third riser card being screwed to a lower board surface of the first long arm, and the fourth riser card being fixed at a lower screw-hole of the second long arm.

* * * * *